(12) United States Patent
Asaishi

(10) Patent No.: US 8,094,289 B2
(45) Date of Patent: Jan. 10, 2012

(54) SCANNING EXPOSURE APPARATUS AND DEVICE MANUFACTURING METHOD

(75) Inventor: Tadahiro Asaishi, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 396 days.

(21) Appl. No.: 12/349,439

(22) Filed: Jan. 6, 2009

(65) Prior Publication Data

US 2009/0174875 A1  Jul. 9, 2009

(30) Foreign Application Priority Data

Jan. 7, 2008 (JP) .................... 2008-000804

(51) Int. Cl.
*G03B 27/42* (2006.01)
*G03B 27/54* (2006.01)
(52) U.S. Cl. ............................. 355/53; 355/67
(58) Field of Classification Search ............... 355/53, 355/67–71; 250/548; 356/399–401
See application file for complete search history.

(56) References Cited

U.S. PATENT DOCUMENTS

| 5,526,093 | A | | 6/1996 | Takahashi |
| 5,892,573 | A | * | 4/1999 | Takahashi et al. .............. 355/61 |
| 6,154,270 | A | * | 11/2000 | Ozawa ............................ 355/53 |
| 6,900,879 | B2 | * | 5/2005 | Nishi .............................. 355/53 |
| 7,119,883 | B2 | * | 10/2006 | Roux et al. ..................... 355/69 |

FOREIGN PATENT DOCUMENTS

JP   7-029810   1/1995

\* cited by examiner

*Primary Examiner* — Hung Henry Nguyen
(74) *Attorney, Agent, or Firm* — Canon USA Inc IP Division

(57) ABSTRACT

A scanning exposure apparatus is configured to project a pattern of an original onto a substrate by a projection optical system while scanning the original and the substrate, thereby scanning-exposing the substrate, the apparatus including a barycentric position adjusting unit configured to adjust, based on a target barycentric position, a barycentric position, in a direction of a scanning axis, of exposure light that irradiates an image plane of the projection optical system.

5 Claims, 12 Drawing Sheets

BARYCENTRIC POSITION OF EXPOSURE LIGHT MATCHES SLIT AXIS

BARYCENTRIC POSITION OF EXPOSURE LIGHT DOES NOT MATCH SLIT AXIS

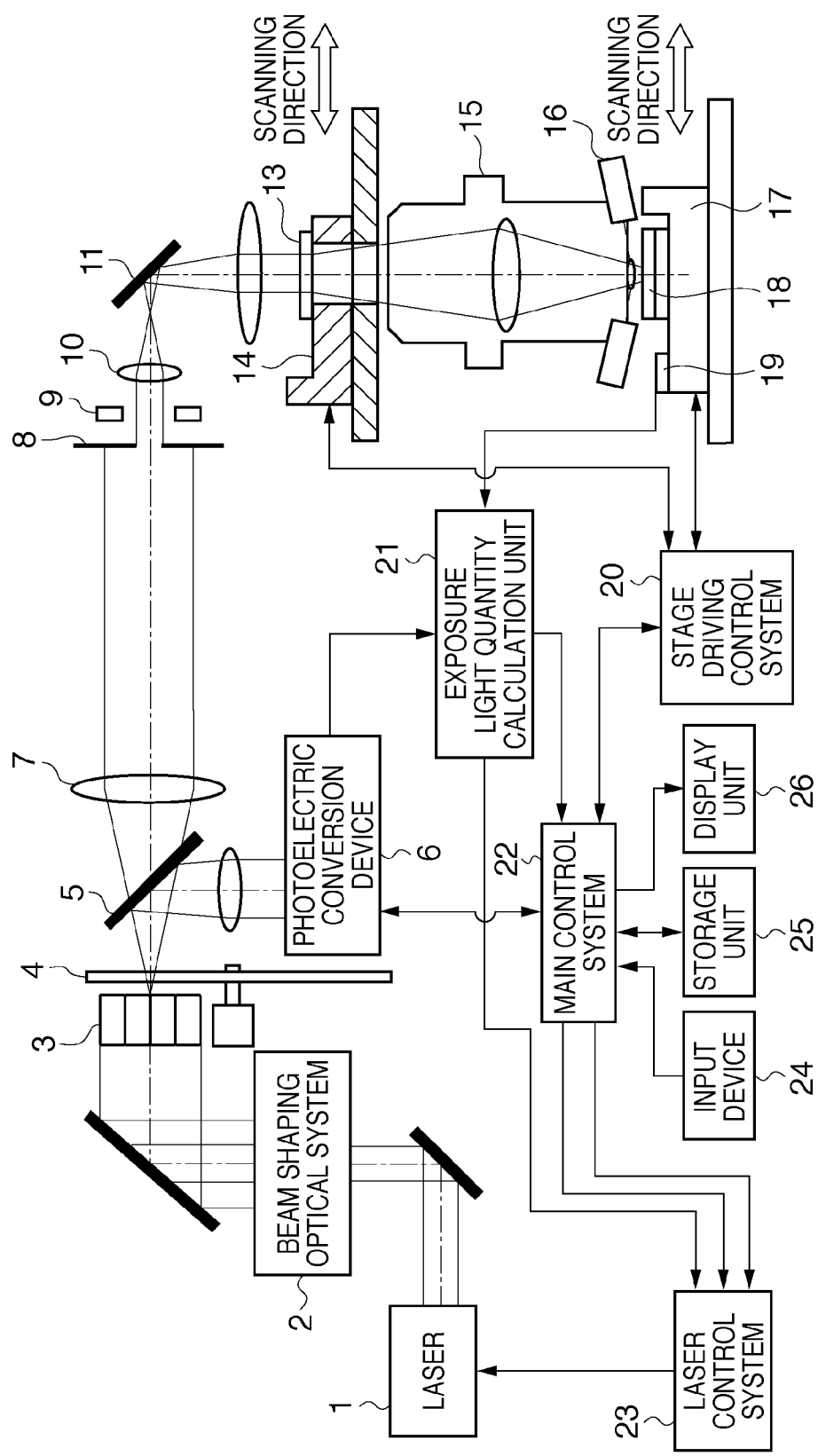

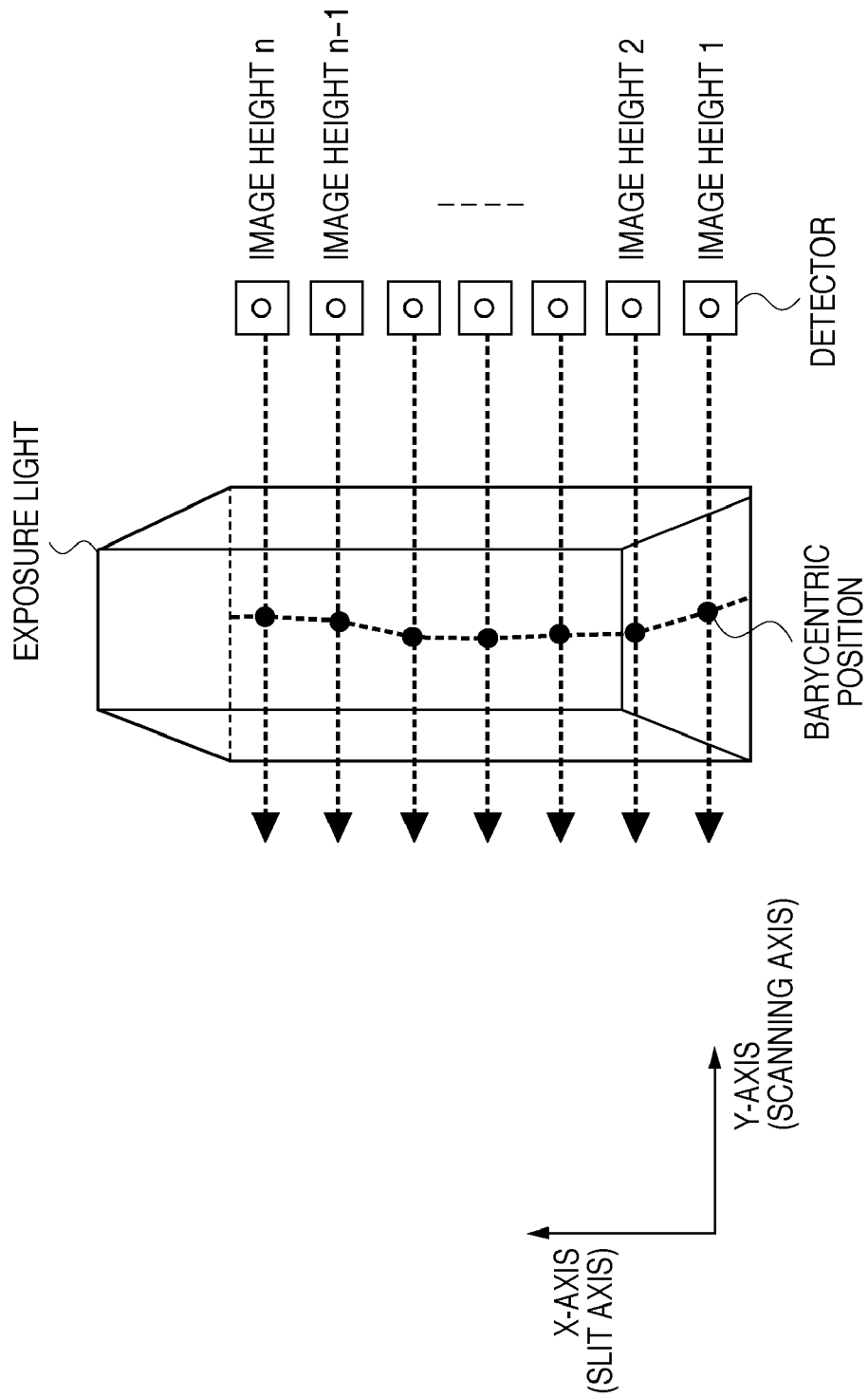

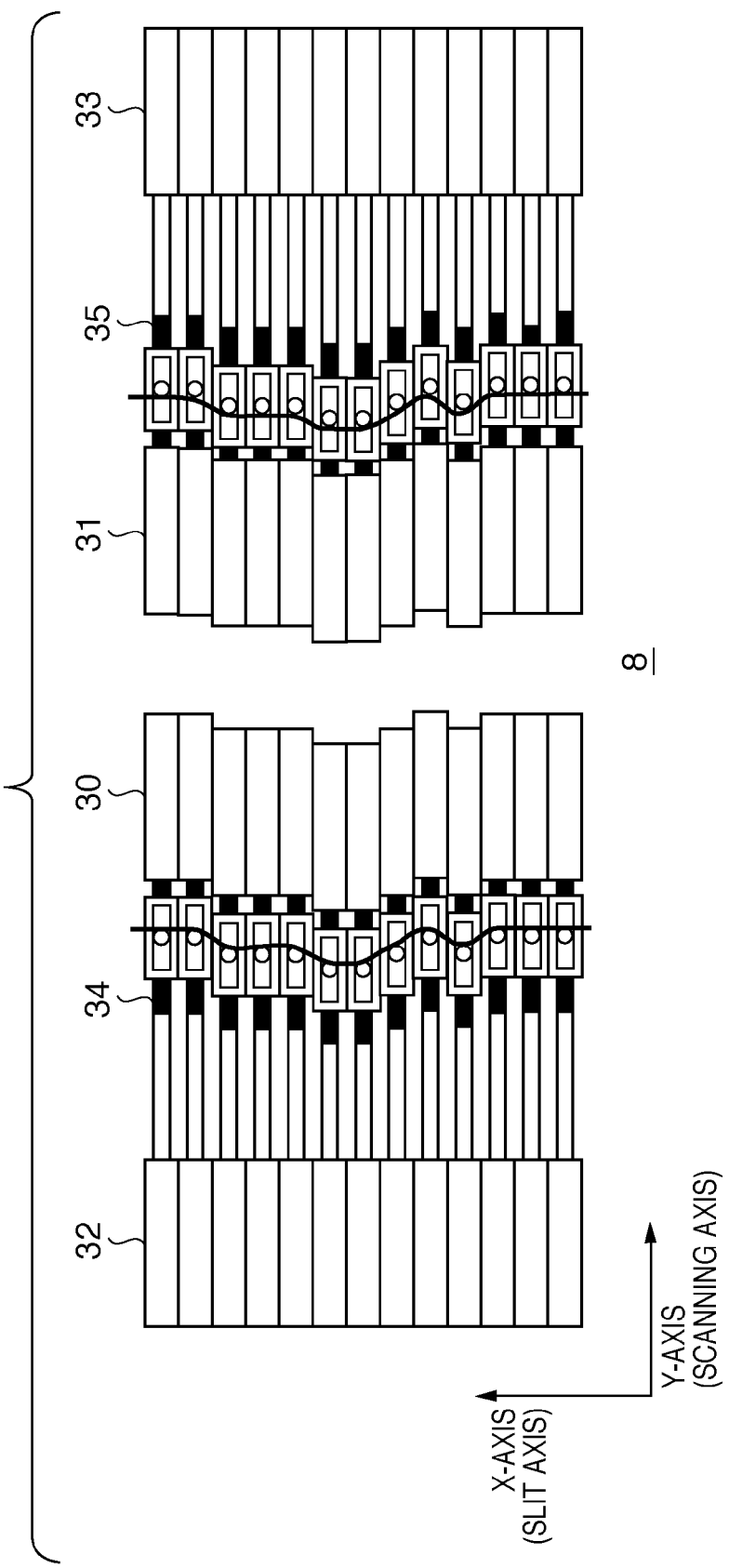

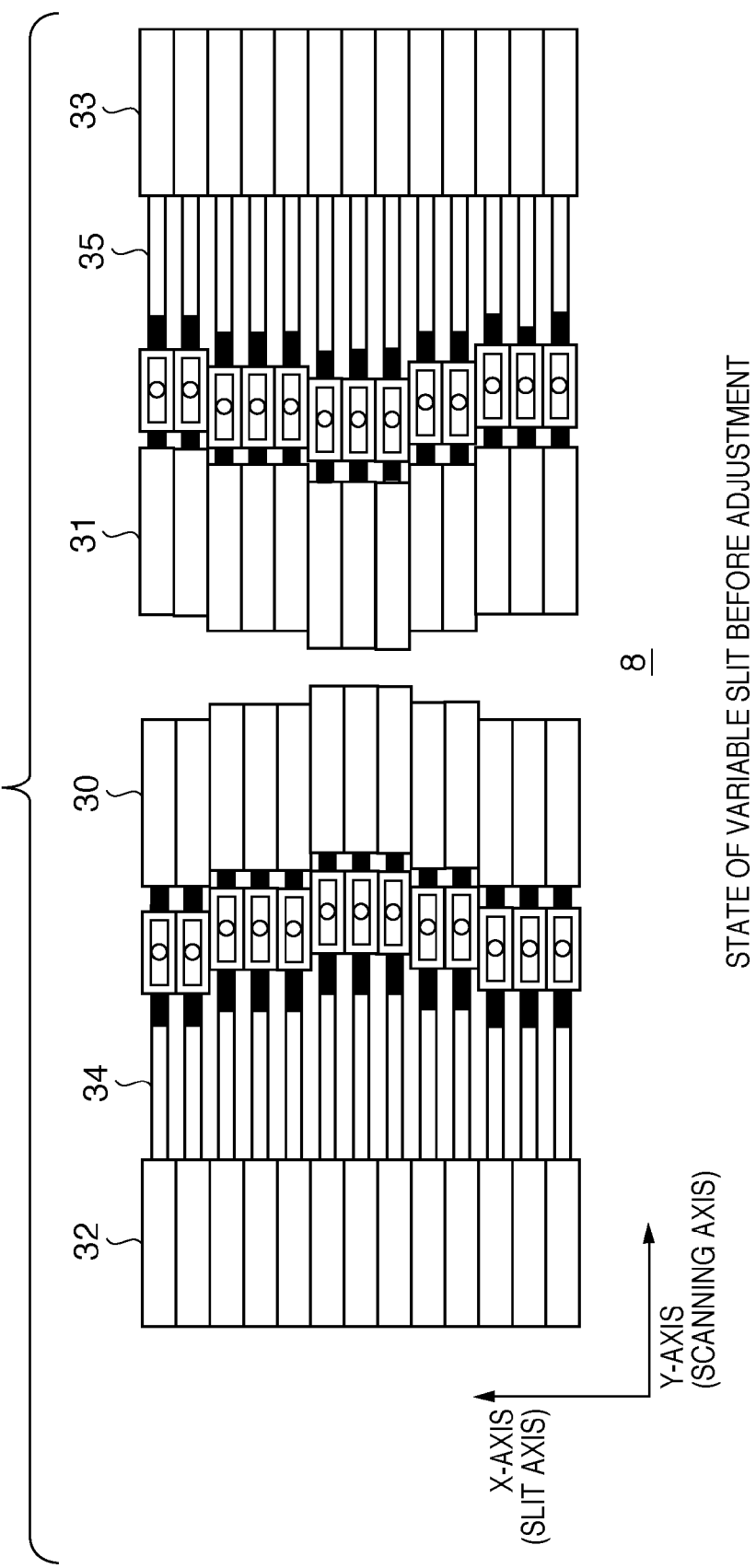

EXPOSURE LIGHT PROFILE ON WAFER SURFACE BEFORE ADJUSTMENT

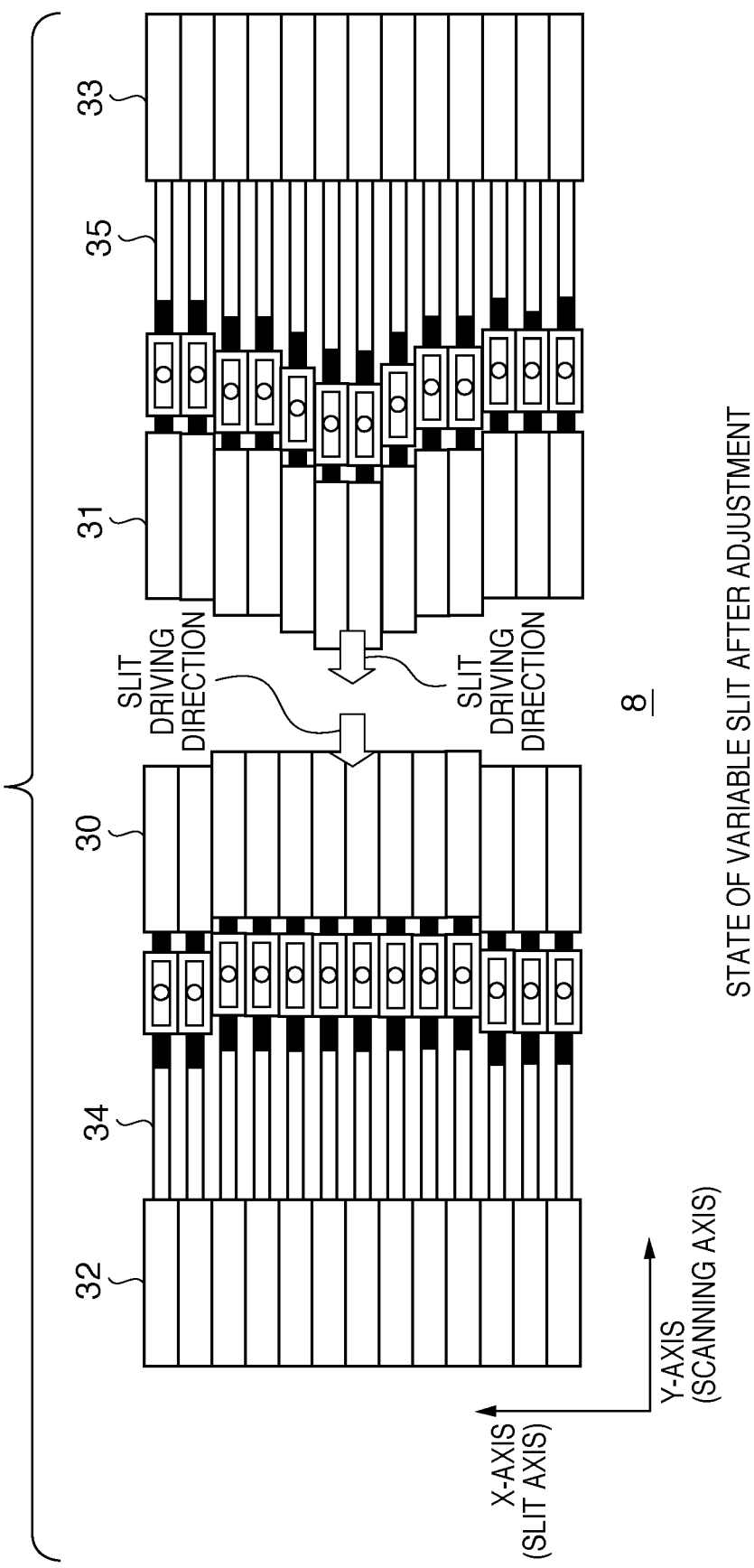

EXPOSURE LIGHT PROFILE ON WAFER SURFACE AFTER ADJUSTMENT

SCANNING EXPOSURE APPARATUS AND DEVICE MANUFACTURING METHOD

BACKGROUND OF THE INVENTION

1. Field of the Invention

The present invention relates to a scanning exposure apparatus and a device manufacturing method of manufacturing a device using the same.

2. Description of the Related Art

Lithography is well known as a method of forming a circuit pattern on a wafer. In lithography, a circuit pattern formed on a reticle is projected onto a wafer, thereby exposing the wafer. The wafer is coated with a photosensitive agent, on which a latent image is formed by exposing the wafer. This latent image is visualized into a physical pattern by a developing process.

In the wafer process of the semiconductor device manufacturing process, a circuit pattern is formed by repeating a step of oxidizing the wafer surface, a step of forming an insulating film, a step of forming an electrode by vapor deposition, an ion implantation step, and an etching step. In this wafer process, the thickness of the insulating film or that of the photosensitive agent in an exposure process often becomes nonuniform. When a wafer on which an insulating film or photosensitive agent having a nonuniform thickness is formed as in this case is exposed, a shift in pattern line width or a failure in resolution is likely to occur, resulting in a decrease in the product yield. Especially in a step and scan exposure apparatus which generally has a relatively wide shot region, large nonuniformity in thickness is likely to occur in the shot region, resulting in a non-negligible failure in resolution.

Japanese Patent Laid-Open No. 7-29810 discloses a solution to the problem by changing the exposure light quantity of the exposure beam on the substrate in accordance with the position on the substrate by changing the illuminance, the time interval of pulse emission by a pulse emission light source, and the scanning speed of a stage.

FIG. 1 is a view illustrating the intensity of exposure light which strikes a wafer. In scanning exposure, the wafer is exposed by repeating light emission by the light source while moving the wafer stage in the direction of the scanning axis.

The barycentric position of the exposure light is the barycentric position of the light intensity distribution in the direction of the scanning axis, as shown in FIG. 1, and is calculated for each image height (each position in the direction of the slit axis). In this specification, a curve obtained by virtually connecting the barycentric positions at respective image heights is called a barycentric line.

When the exposure light quantity is changed in accordance with the method described in Japanese Patent Laid-Open No. 7-29810, a change in the exposure light quantity after scanning exposure (the time integral of the exposure light intensity) depends on the curvature of the barycentric line, as illustrated in FIGS. 2A and 2B. In the example shown in FIGS. 2A and 2B, the exposure light intensity linearly increases in the direction of the scanning axis.

FIG. 2A shows an example in which the barycentric line of the exposure light is parallel to the slit axis. FIG. 2B shows an example in which the barycentric line of the exposure light is curved. Referring to FIGS. 2A and 2B, the exposure light quantity in the scanning-exposed shot region exhibits nonuniformity that depends on the curvature of the barycentric line of the exposure light. In view of this, the barycentric line of the exposure light must be adjusted in accordance with the exposure light profile in changing the exposure light intensity in accordance with the position in the direction of the scanning axis. Note that the preferable shape of this barycentric line can be a straight line or a controlled curve according to the circumstances involved.

SUMMARY OF THE INVENTION

The present invention is directed to a technique suitable for controlling, e.g., the exposure light quantity in the shot region with a higher accuracy.

According to one aspect of the present invention, there is provided a scanning exposure apparatus which projects a pattern of an original onto a substrate by a projection optical system while scanning the original and the substrate, thereby scanning-exposing the substrate, the apparatus including a barycentric position adjusting unit configured to adjust, based on a target barycentric position, a barycentric position, in a direction of a scanning axis, of exposure light that irradiates an image plane of the projection optical system.

According to another aspect of the present invention, there is provided a device manufacturing method including the steps of exposing a substrate using a scanning exposure apparatus and developing the substrate. The scanning exposure apparatus is configured to project a pattern of an original onto a substrate by a projection optical system while scanning the original and the substrate, thereby scanning-exposing the substrate. The exposure apparatus includes a barycentric position adjusting unit configured to adjust, based on a target barycentric position, a barycentric position, in a direction of a scanning axis, of exposure light that irradiates an image plane of the projection optical system.

Further features of the present invention will become apparent from the following description of exemplary embodiments with reference to the attached drawings.

BRIEF DESCRIPTION OF THE DRAWINGS

FIG. 3 is a block diagram showing the schematic configuration of a scanning exposure apparatus according to a preferred embodiment of the present invention;

FIG. 6 is a view for explaining the measurement of the barycentric position of the exposure light;

FIG. 7 is a view showing an arrangement example of a variable slit;

FIG. 8A is a view illustrating the state of the variable slit before adjustment;

FIG. 8C is a view illustrating the state of the variable slit after adjustment;

DESCRIPTION OF THE EMBODIMENTS

Figure 1:
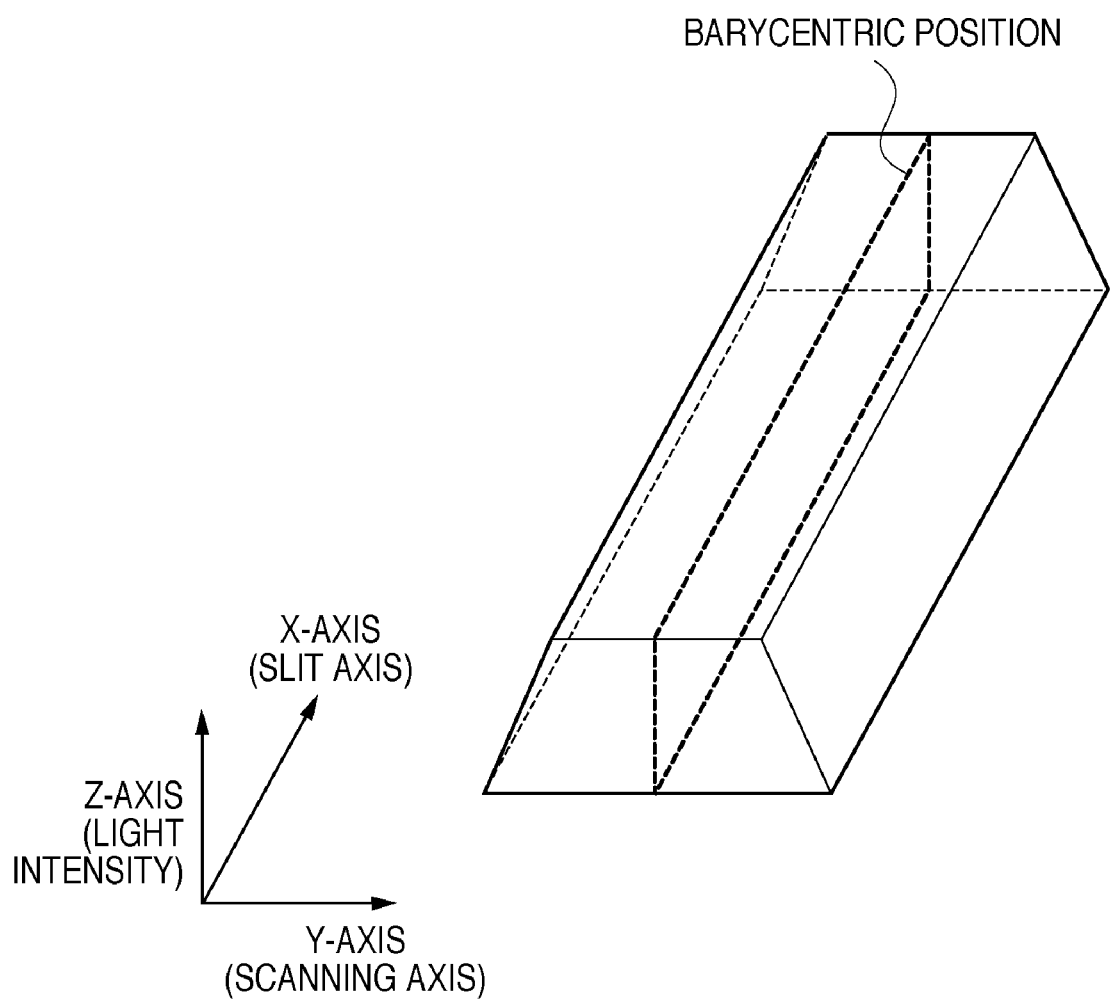
FIG. 1 is a view illustrating the intensity of exposure light which strikes a wafer.
Figure 2A:
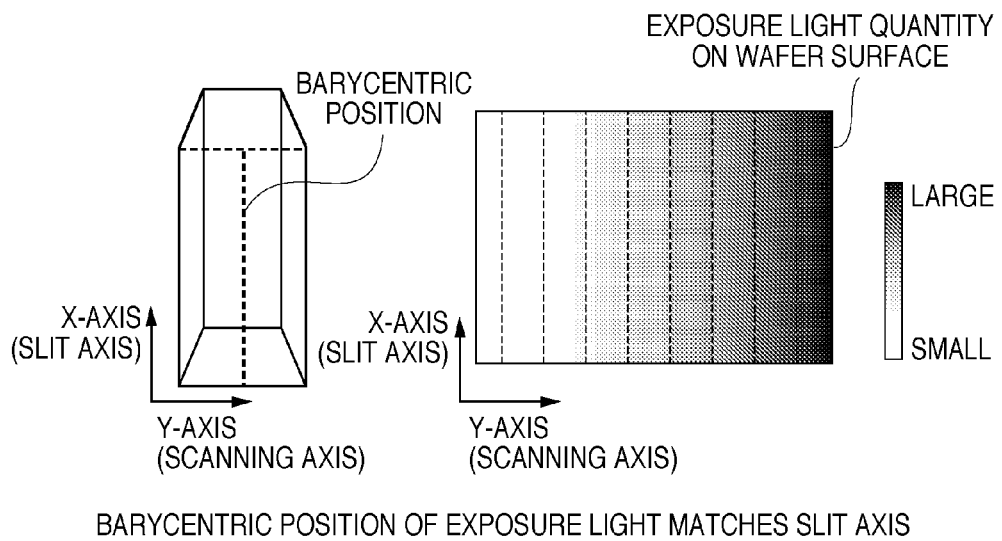
FIGS. 2A and 2B are views illustrating the relationship between the exposure light quantity and the curvature of the barycentric line of the exposure light.
Figure 2B:
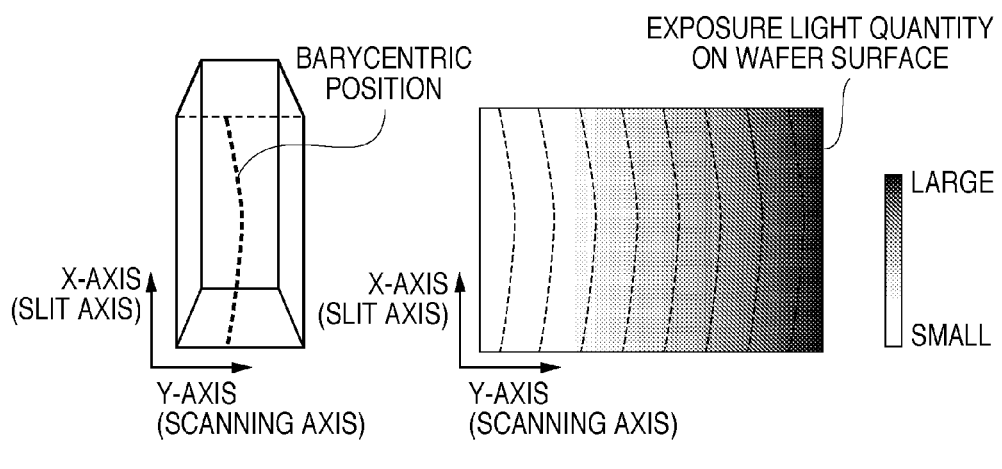

Exemplary embodiments of the present invention will be described below with reference to the accompanying drawings.

FIG. 3 is a block diagram showing the schematic configuration of a scanning exposure apparatus according to an exemplary embodiment of the present invention. Referring to FIG. 3, light (pulse light) emitted by a laser (light source) 1 is shaped into a predetermined sectional shape upon propagating through a beam shaping optical system 2, and enters an optical integrator 3. The optical integrator 3 includes a plurality of microlenses, and forms a plurality of secondary sources on its exit surface.

A stop turret 4 is formed by forming a plurality of stops in a rotary plate. The selected stop is inserted into the optical path, thereby extracting a necessary region from the region in which the plurality of secondary sources are formed. Examples of the plurality of stops are a plurality of aperture stops having different circular aperture areas to set the coherence factor σ, ring-like stops for annular illumination, and quadrupole stops.

A first photoelectric conversion device 6 detects a certain component of the light reflected by a half mirror 5 as the light quantity per pulse, and outputs the detection result to an exposure light quantity calculation unit 21.

A condenser lens 7 illuminates a masking blade 9 with the light from the plurality of secondary sources formed on the exit surface of the optical integrator 3. A variable slit 8 is located near the masking blade 9, and shapes the profile of the light which illuminates the masking blade 9 into a slit shape (e.g., a rectangular shape or arc shape). The light having passed through the aperture region on the masking blade 9 forms an image, with a uniform illuminance and incident angle via a condenser lens 10 and mirror 11, on the surface of a reticle (original) 13 located on a plane conjugate to that on which the masking blade 9 is located. The aperture region on the masking blade 9 is similar to the illumination region on the reticle 13 at an optical magnification ratio.

The reticle 13 is held by a reticle stage 14. The light having passed through the reticle 13 forms an optical image again in the exposure angle-of-view region on a plane optically conjugate to the pattern surface of the reticle 13 upon propagating through a projection optical system 15. A focus detection system 16 detects the level and tilt of the surface of a wafer (substrate) 18 held by a wafer stage 17. In scanning exposure, the reticle stage 14 and wafer stage 17 are synchronously scanned relative to the projection optical system 15 while controlling the wafer stage 17 so that the surface of the wafer 18 is aligned with the image plane of the projection optical system 15, on the basis of the information detected by the focus detection system 16. At this time, the wafer 18 is relatively scanned by slit-shaped light, and the pattern of the reticle 13 is transferred onto the photosensitive agent on the wafer 18.

A second photoelectric conversion device (detector) 19 is arranged on the wafer stage 17, and can measure the quantity of light which enters the exposure angle-of-view region. The second photoelectric conversion device (detector) 19 can include, e.g., a photodiode, an image sensor (e.g., a CCD image sensor), or a line sensor (e.g., a CCD line sensor). A stage driving control system 20 controls the driving of the reticle stage 14 and wafer stage 17 by a driving mechanism (not shown).

The first photoelectric conversion device 6 can measure the exposure light quantity even during wafer exposure. The second photoelectric conversion device 19 detects the quantity of slit-shaped exposure light which forms an image on the image plane of the projection optical system 15 while wafer exposure is not performed. The exposure light quantity calculation unit 21 obtains and holds a correlation between the outputs from the first photoelectric conversion device 6 and the second photoelectric conversion device 19. On the basis of this correlation and the output from the first photoelectric conversion device 6, the exposure light quantity calculation unit 21 calculates the exposure light quantity in exposure to generate a light quantity signal, and provides it to a main control system 22.

By scanning-driving the wafer stage 17 so that the second photoelectric conversion device 19 passes through an arbitrary position in the region in which the slit-shaped exposure light forms an image on the image plane of the projection optical system 15, the integrated exposure light quantity of this exposure light can be measured.

A laser control system 23 outputs a trigger signal and applied voltage signal in accordance with a target pulse light quantity, thereby controlling the oscillation frequency and output energy of the light source 1. Note that the laser control system 23 generates a trigger signal and applied voltage signal on the basis of the light quantity signal output from the exposure light quantity calculation unit 21, and the exposure parameters output from the main control system 22.

The exposure parameters (e.g., the integrated exposure light quantity, required integrated exposure light quantity accuracy, and stop shape) are provided to the main control system 22 by an input device 24 serving as a man-machine interface or media interface, and are stored in a storage unit 25.

A method of measuring the barycentric position of the exposure light according to an exemplary embodiment of the present invention will be explained below.

Figure 4:
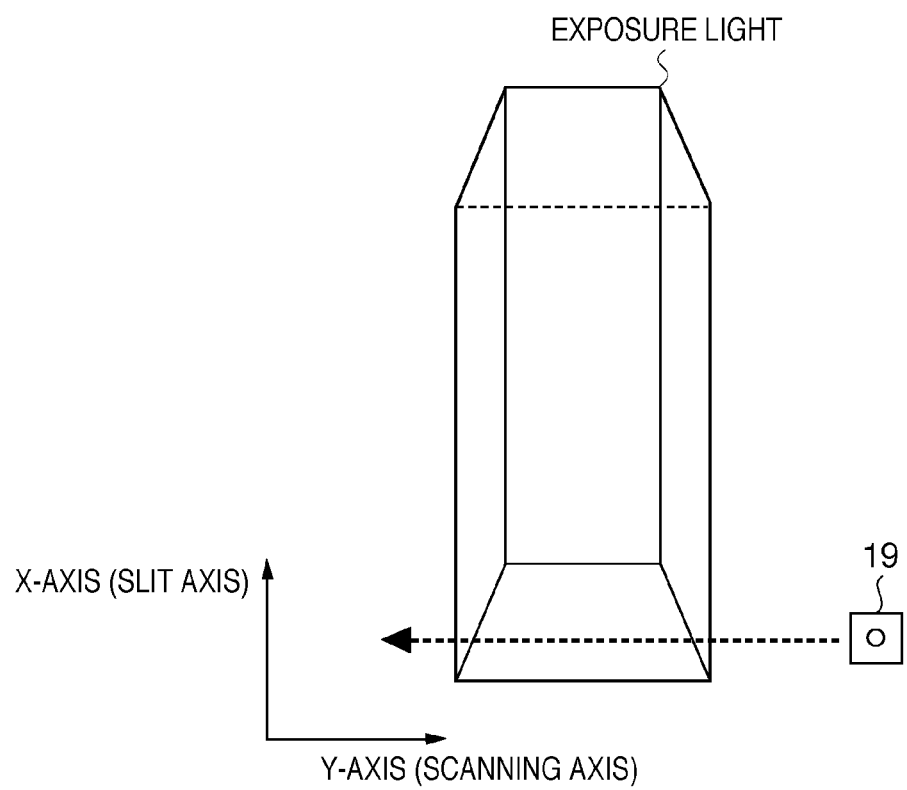
FIG. 4 is a view for explaining the measurement of the barycentric position of the exposure light.

As schematically shown in FIG. 4, the wafer stage 17 is scanned so that the second photoelectric conversion device (detector) 19 arranged on the wafer stage 17 passes through the slit-shaped exposure light on the image plane of the projection optical system 15 in the direction of the scanning axis. Note that the scanning axis is an axis along which the wafer stage 17 (or wafer 18) or the reticle stage 14 (or reticle 13) is scanned. The slit axis matches a direction perpendicular to the scanning axis. The dimension of the slit-shaped exposure light in the direction of the scanning axis is shorter than that of the slit-shaped exposure light in the direction of the slit axis.

Figure 5:
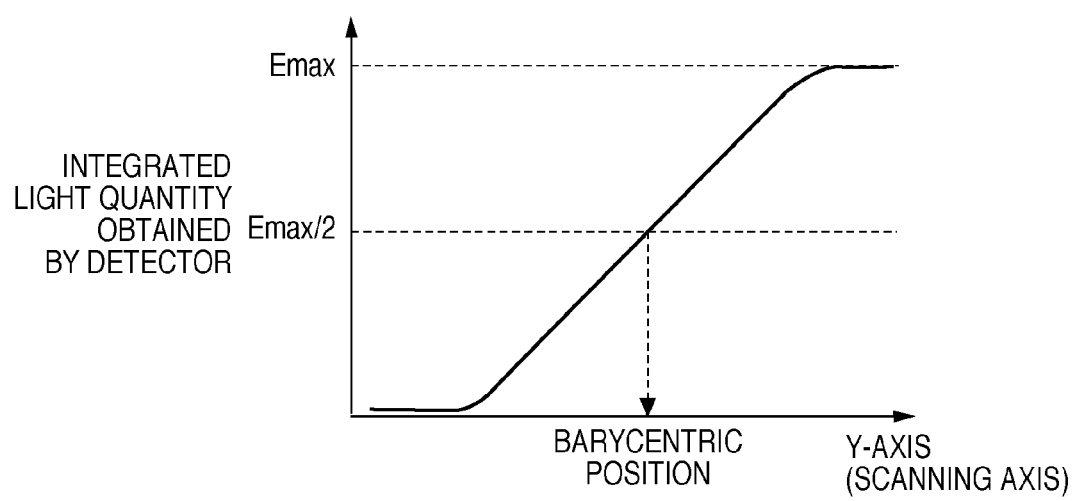
FIG. 5 is a graph for explaining the measurement of the barycentric position of the exposure light.

FIG. 5 is a graph illustrating the integrated light quantity obtained by integrating the light quantity output from the second photoelectric conversion device (detector) 19 upon scanning the wafer stage 17. Note that the integration may be performed by the second photoelectric conversion device 19, main control system 22, or another device. Referring to FIG. 5, the abscissa indicates the position of the wafer stage 17 in the direction of the scanning axis, and the ordinate indicates the integrated light quantity of the exposure light. The barycentric position is the position of the wafer stage 17, at which a half of the maximum value (Emax) of the integrated light quantity of the exposure light is obtained.

FIG. 6 is a view showing a detailed example of a method of measuring the barycentric line of the exposure light. First, to measure the barycentric position at "image height 1", the wafer stage 17 is driven so that the position of the second photoelectric conversion device (detector) 19 in the direction of the slit axis matches "image height 1", and the position of the second photoelectric conversion device (detector) 19 in the direction of the scanning axis matches the scanning start position.

Next, while the wafer stage 17 is driven so that the second photoelectric conversion device (detector) 19 is scanned in the direction of the scanning axis while the image plane of the projection optical system 15 is irradiated with the exposure light, the second photoelectric conversion device (detector) 19 detects the exposure light quantity and obtains the integrated light quantity.

Lastly, the barycentric position of the exposure light is obtained based on a change in integrated light quantity by the method explained with reference to FIG. 5.

By performing the above-described process for "image height 2" to "image height n" as well, the barycentric positions of the exposure light are obtained for "image height 1" to "image height n". A line which virtually connects the respective barycentric positions at "image height 1" to "image height n" is the barycentric line of the exposure light.

A method of adjusting the barycentric position of the exposure light according to an exemplary embodiment of the present invention will be explained below. FIG. 7 is a view showing the arrangement of the variable slit (barycentric position adjusting unit) 8 according to an exemplary embodiment of the present invention. The variable slit 8 includes a plurality of first movable blades 30 and a plurality of second movable blades 31 as members to define the slit as an aperture. The dimension (width) of the slit in the direction of the scanning axis is determined in accordance with the intervals between the edges of the first blades 30 and the second blades 31.

The variable slit 8 also includes a plurality of first linear actuators 32 and a plurality of second linear actuators 33. The plurality of first linear actuators 32 drive the plurality of first blades 30 in the direction of the scanning axis in accordance with a command from the main control system 22. The plurality of second linear actuators 33 drive the plurality of second blades 31 in the direction of the scanning axis in accordance with a command from the main control system 22.

The plurality of first blades 30 can be guided by a first guide mechanism 34. The plurality of second blades 31 can be guided by a second guide mechanism 35.

Figure 8B:
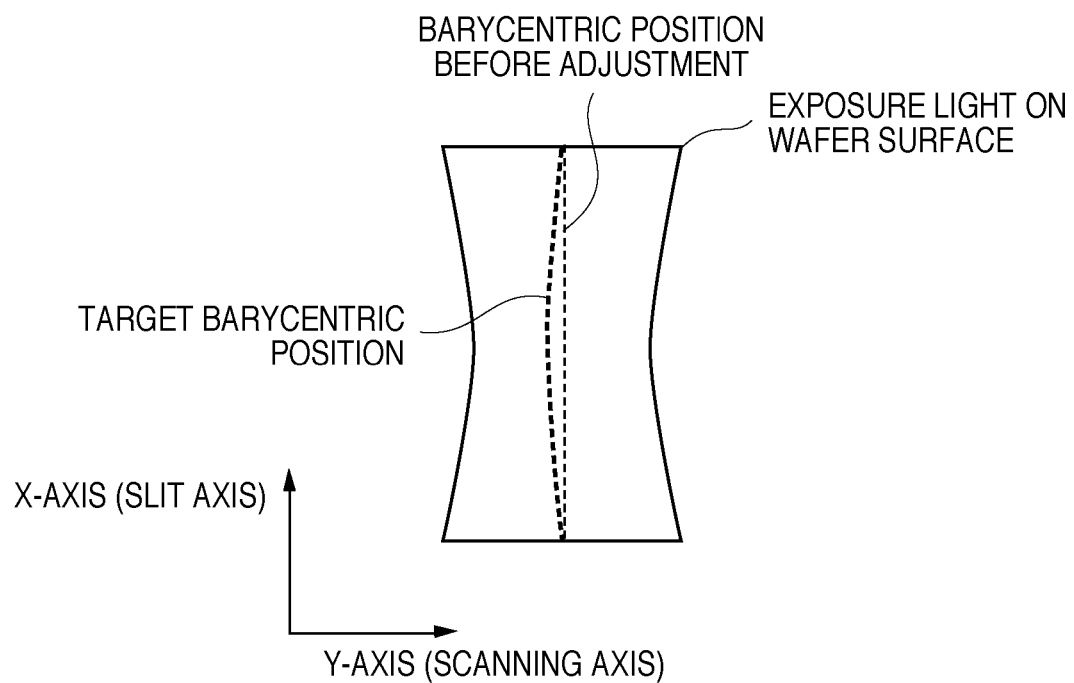
FIG. 8B is a view illustrating an exposure light profile on the wafer surface (the image plane of a projection optical system), which is formed by the variable slit before adjustment.

FIGS. 8A to 8D show the relationship between the exposure light profile and the adjustment of the variable slit. FIG. 8A illustrates the state of the variable slit 8 before adjustment, and FIG. 8B illustrates an exposure light profile on the wafer surface (the image plane of the projection optical system), which is formed by the variable slit 8 in the state shown in FIG. 8A. FIG. 8B illustrates the barycentric line before adjustment and the target barycentric line (reference line).

Figure 8D:
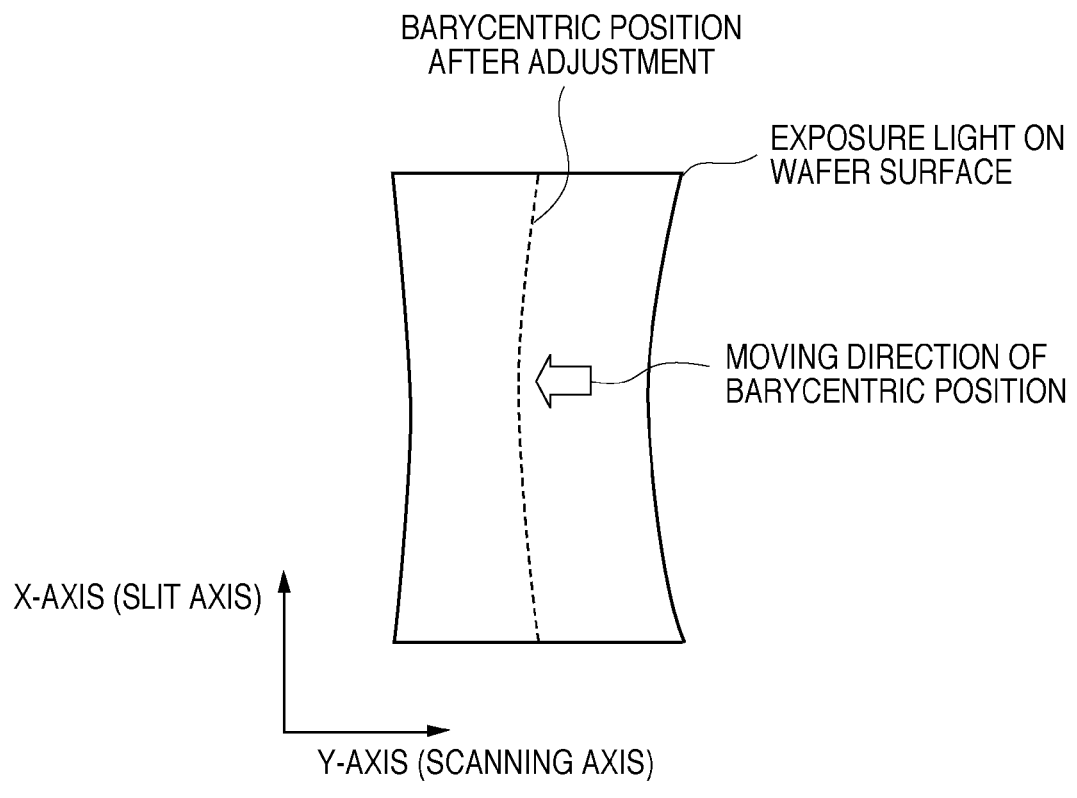
FIG. 8D is a view illustrating an exposure light profile on the wafer surface (the image plane of the projection optical system), which is formed by the variable slit after adjustment.

FIG. 8C illustrates a state in which all or some of the plurality of first linear actuators 32 and all or some of the plurality of second linear actuators 33 are operated in accordance with commands from the main control system 22 so that the actual barycentric position of the exposure light falls within an allowance for the target barycentric position. FIG. 8D illustrates an exposure light profile on the wafer surface (the image plane of the projection optical system), which is formed by the variable slit 8 in the state shown in FIG. 8C.

The main control system 22 can calculate positions D of the blades 30 and 31 to adjust the barycentric position, in accordance with:

$$D=D\_def+\alpha\times(P\_1-P\_2) \quad (1)$$

where D_def is the positions of the blades before adjustment, α is the magnification of the optical system between the variable slit and the wafer surface, P_1 is the target barycentric position of the exposure light, and P_2 is the barycentric position of the exposure light before adjustment.

If the imaging magnification is 1, to correct a shift of the barycentric position of the exposure light, the first blades 30 and the second blades 31 of the variable slit 8 are driven by the same amount of shift as that of the barycentric position of the exposure light.

Figure 9:
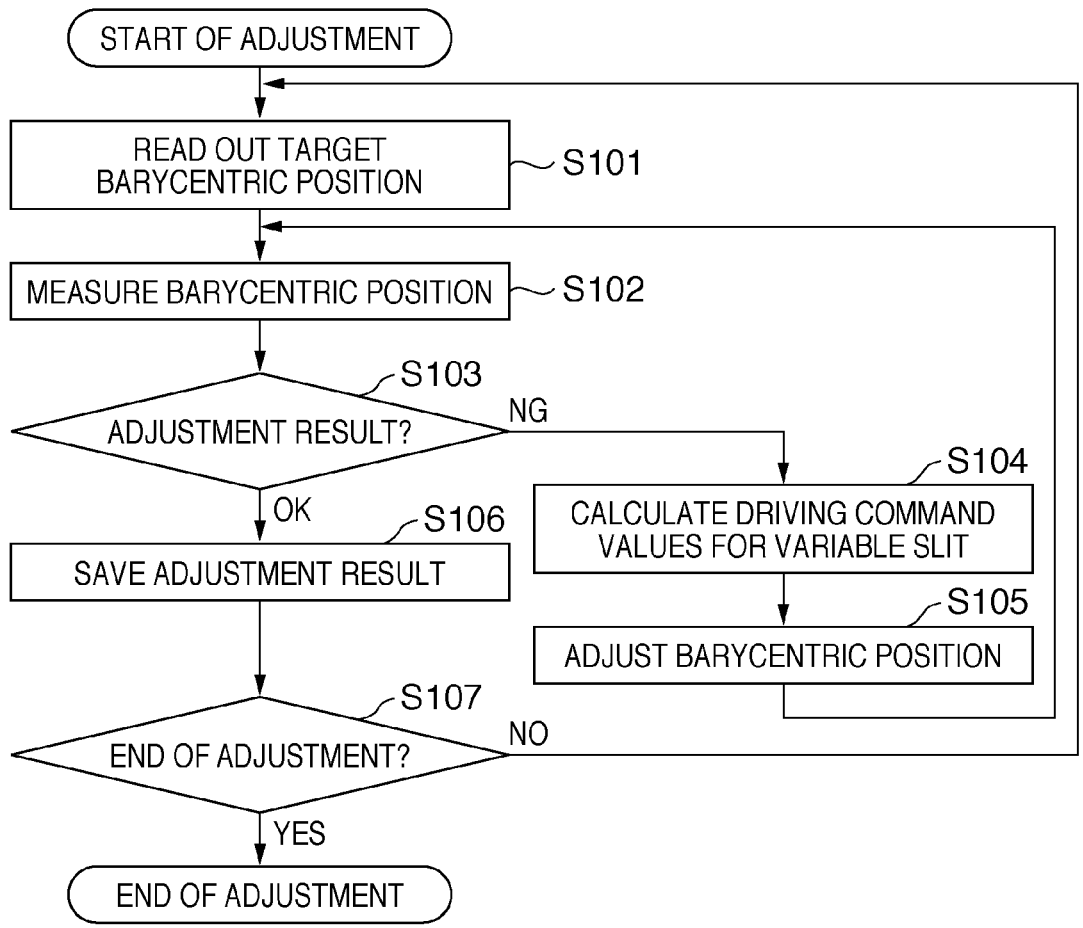
FIG. 9 is a flowchart illustrating a sequence of adjusting the barycentric position of the exposure light.

FIG. 9 is a flowchart illustrating a sequence of adjusting the barycentric position of the exposure light. This sequence can be controlled by the main control system 22. In the initial state, the variable slit 8 is located in a predetermined state.

In step S101, the main control system 22 reads out the target barycentric position at each image height. The target barycentric position (barycentric line or reference line) depends on an exposure process such as a photosensitive agent coating process, and therefore can be determined based on data input by the operator via the input device 24. For example, the barycentric line (reference line) is an arc-shaped curve for an arc-shaped illumination region for use in arc illumination in EUV lithography.

The plurality of first blades and the plurality of second blades are adjusted based on the target barycentric line. Also, the barycentric positions may be maintained constant irrespective of the movement of the blades so that they lie on the target barycentric line from the beginning by setting the blade guide mechanisms based on the barycentric line. For example, a case in which the light quantity barycentric positions lie at the midpoints between the edge positions of the plurality of first blades and the plurality of second blades will be considered. In this case, when the first blades and the second blades move in opposite directions by the same moving amount, the barycentric positions remain at the midpoints.

In step S102, the main control system 22 detects the quantity of the slit-shaped exposure light on the image plane of the projection optical system 15 in accordance with the above-described method by the second photoelectric conversion device (detector) 19, thereby obtaining/measuring the barycentric position of the exposure light at each image height.

In step S103, the main control system 22 checks the appropriateness of the barycentric position of the exposure light obtained in step S103. More specifically, for example, the main control system 22 compares the barycentric position of the exposure light obtained in step S102 with the target barycentric position acquired in step S101 to determine that the barycentric position of the exposure light is "appropriate" if their difference falls within the allowance, and that it is "inappropriate" if their difference falls outside the allowance. The main control system 22 advances the process to step S106 if the determination result is "appropriate", while it returns the process to step S102 if the determination result is "inappropriate".

In step S104, the main control system 22 calculates the positions of the plurality of first blades 30 and the plurality of second blades 31 in accordance with equation (1). On the basis of the calculation result, the main control system 22 calculates driving command values for the plurality of first linear actuators 32 and the plurality of second linear actuators 33.

Note that in equation (1), D_def is the positions of the blades 30 and 31 when the barycentric positions are measured in step S102, P_1 is the target barycentric position of the exposure light read out in step S101, and $P_{13}2$ is the barycentric position of the exposure light measured in step S102.

The positions of the plurality of first blades 30 and the plurality of second blades 31 may be determined from the viewpoint of not only adjusting the barycentric position of the exposure light but also reducing illuminance nonuniformity in the direction of the slit axis.

In step S105, the driving command values calculated in step S104 are sent to the plurality of first linear actuators 32 and the plurality of second linear actuators 33. With this operation, the positions of the plurality of first blades 30 and the plurality of second blades 31 are adjusted. After that, step S102 is executed again.

In step S106, the target barycentric position read out in step S101 and the driving amounts of the blades 30 and 31 (the driving command values for the linear actuators 32 and 33) are saved. In a wafer exposure sequence, the blades 30 and 31 are driven based on the driving amounts saved at this time.

In step S107, the main control system 22 determines whether to perform barycentric position adjustment corresponding to another condition. If the barycentric position adjustment is performed, the process returns to step S101, and the process operations in steps S101 to S106 are repeated for other conditions. In this manner, in this embodiment, the driving amounts of the blades 30 and 31 (i.e., the setting of the variable slit 8) can be determined for each of a plurality of conditions (e.g., a plurality of illumination conditions and a plurality of slit dimensions).

Figure 10:
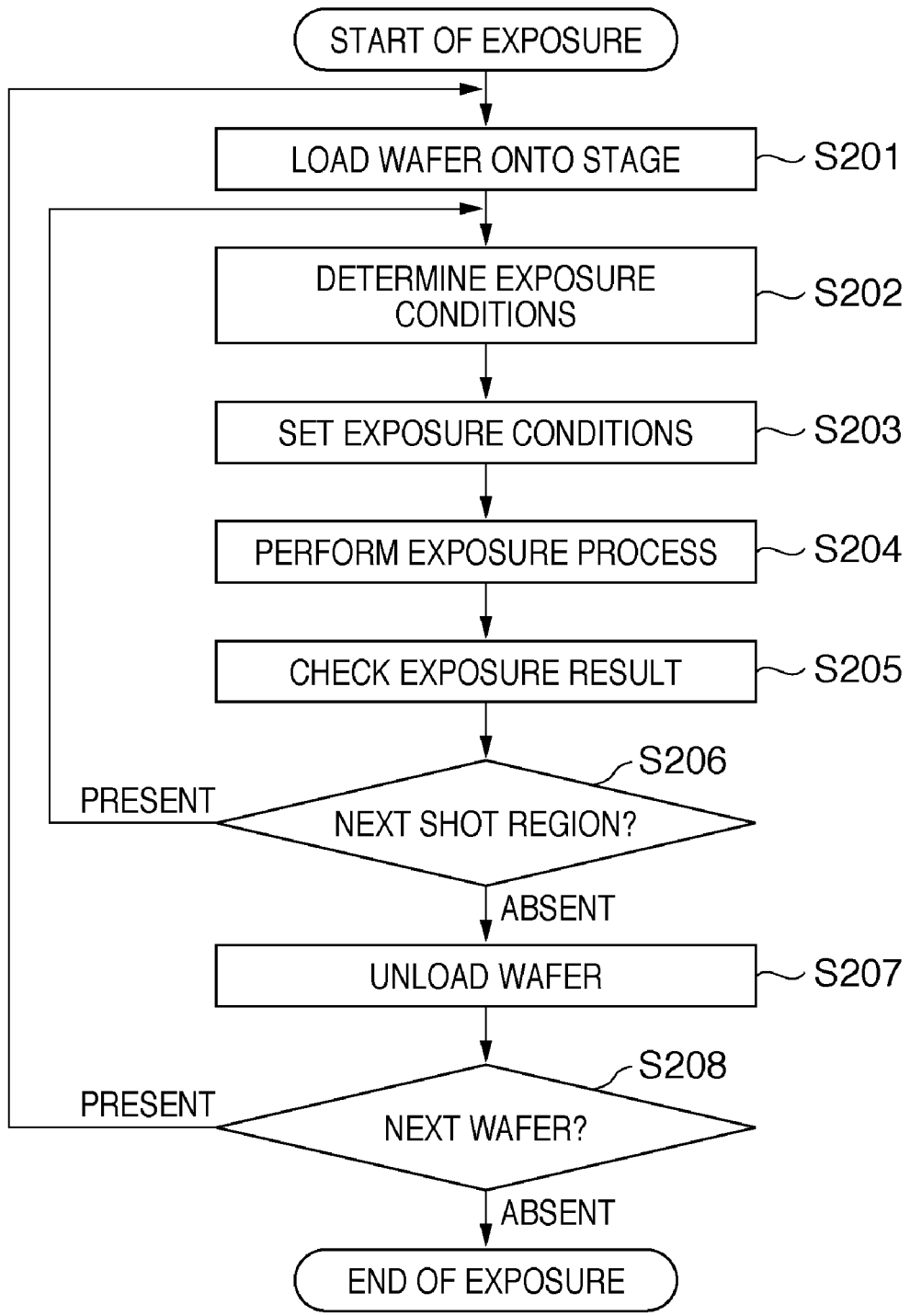
FIG. 10 is a flowchart schematically illustrating a wafer exposure sequence.

FIG. 10 is a flowchart schematically illustrating a wafer exposure sequence. In step S201, a wafer is loaded onto the wafer stage 17 of the exposure apparatus. Along with this loading, various kinds of measurement operations such as wafer position measurement and focal plane measurement can be performed under the control of the main control system 22.

In step S202, the main control system 22 determines the scanning speeds of the stages 14 and 17, the oscillation frequency of the light source, the target energy of light emitted by the light source, the light emission pulse number of the light source, the setting of the variable slit 8, in accordance with, e.g., the exposure light quantity and exposure light shape included in the recipe of an exposure job. The setting of the variable slit 8 includes the driving positions of the plurality of first blades 30 and the plurality of second blades 31. Note that the driving positions of the plurality of first blades 30 and the plurality of second blades 31 of the variable slit 8 can be determined based on the information saved in advance in the sequence shown in FIG. 9. However, if the driving positions of the first blades 30 and the second blades 31 under conditions matching the exposure light quantity and exposure light shape included in the recipe of an exposure job are not registered in advance, the sequence in steps S101 to S106 shown in FIG. 9 may be executed under these conditions.

Assume that the exposure light quantity distribution is nonuniform in the wafer shot region. As for the direction of the scanning axis (Y direction), the exposure light quantity is changed in accordance with the position of the substrate in the direction of the scanning axis by adjusting the scanning speed of the wafer stage 17 and the oscillation frequency and target energy of the laser 1. As for the direction of the slit axis, the intervals between the edges of the first blades 30 and the second blades 31 are changed so as to reduce illuminance nonuniformity of the exposure light in the direction of the slit axis.

A supplemental description of the determination of the driving positions of the first blades 30 and the second blades 31 will be given. The main control system 22 can determine an optimal barycentric position of the exposure light on the basis of the designated exposure light quantity. The main control system 22 can perform this determination by looking up a prescribed function or table describing the relationship between the exposure light quantity and an optimal barycentric position of the exposure light corresponding to it. Also, data representing the relationship between the barycentric position of the exposure light and the driving amounts of the blades 30 and 31 to achieve the barycentric position may be accumulated by repeating the sequence shown in FIG. 9 and interpolated, thereby determining driving amounts that achieve an arbitrary barycentric position.

In step S203, the main control system 22 sets the exposure conditions determined in step S202 in an appropriate control system. More specifically, the main control system 22 sets the oscillation frequency, target energy, and light emission pulse number of the laser 1 in the laser control system 23, sets the scanning speeds of the stages 14 and 17 in the stage driving control system 20, and sets the driving positions of the blades 30 and 31 of the variable slit 8 in a control unit (not shown) involved. Note that the plurality of first blades 30 and the plurality of second blades 31 of the variable slit 8 are driven on the basis of this setting before the start of exposure.

In step S204, the main control system 22 controls the control systems to expose the wafer. The stage driving control system 20 drives the stages 14 and 17 in accordance with the set conditions, and the laser control system 23 controls the oscillation of the laser 1 in synchronism with the movement of the stages 14 and 17.

In step S205, the main control system 22 checks the exposure result for the exposed shot region. This check can include check of the light quality (e.g., the oscillation wavelength and line width) during exposure, and check of the exposure light quantity for the shot region.

The light quality is checked by, e.g., calculating absolute errors of the oscillation wavelength and line width monitored during exposure with respect to their setting values, and their nonuniformities for each pulse. If each calculation value exceeds an error check threshold in the exposure of a certain shot region, this exposure is determined to have suffered an error. Also, the exposure light quantity is checked by calculating an absolute error of the exposure quantity monitored by the first photoelectric conversion device 6 shown in FIG. 3 during exposure with respect to its setting value, and its nonuniformity for each pulse. If each calculation value exceeds an error check threshold in the exposure of a certain shot region, this exposure is determined to have suffered an error. If error determination has been done, error information is provided to the operator via, e.g., a display unit 26.

In step S206, the main control system 22 checks whether a shot region to be exposed remains on the wafer. If a shot region to be exposed remains, the main control system 22 returns the process to step S202 to process the next shot region. If no shot region to be exposed remains, the main control system 22 advances the process to step S207.

In step S207, the exposed wafer on the wafer stage 17 is stored in a wafer storage case.

In step S208, it is checked whether a wafer to be processed remains. If a wafer to be processed remains, the process operations in steps S201 to S207 are repeated. If no wafer to be processed remains, the exposure sequence ends.

Although the above-described embodiments have exemplified a case in which the variable slit 8 is used as a barycentric position adjusting unit for adjusting the barycentric position of the exposure light, the barycentric position adjusting unit may be, e.g., the masking blade 9 or a neutral density filter (not shown). The neutral density filter includes a light-transmitting portion which transmits light, and a light-shielding portion which shields the light. The quantity of light transmitted through the light-transmitting portion changes depending on the position.

A device manufacturing method according to the exemplary embodiments of the present invention is suitable for the manufacture of devices (e.g., a semiconductor device and liquid crystal device). This method can include a step of exposing a substrate coated with a photoresist to light by using the above exposure apparatus, and a step of developing the substrate exposed in the exposing step. In addition to the above steps, the device manufacturing method can include other known steps (e.g., oxidation, film forming, evaporation, doping, planarization, etching, resist removing, dicing, boding, and packaging steps).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-000804, filed Jan. 7, 2008, which is hereby incorporated by reference herein in its entirety.

What is claimed is:

1. A scanning exposure apparatus which projects a pattern of an original onto a substrate by a projection optical system while scanning the original and the substrate along a first direction, thereby exposing the substrate, the apparatus comprising:
  a barycentric position adjusting unit configured to adjust a barycentric position, in the first direction, of exposure light that irradiates an image plane of the projection optical system; and
  a detector mounted on a substrate stage and configured to detect the barycentric position, in the first direction, of the exposure light at each of a plurality of image heights in a second direction that is perpendicular to the first direction, by detecting quantity of the exposure light when the substrate stage is scanned in the first direction,
  wherein the barycentric position adjusting unit includes a plurality of first blades arranged along the second direction, and a plurality of second blades arranged along the second direction such that edges of the plurality of second blades face edges of the plurality of first blades, the plurality of first blades and the plurality of second blades defining an illumination region of the original, and
  wherein the barycentric position adjusting unit adjusts the barycentric position in the first direction at each of the plurality of image heights in the second direction by adjusting the plurality of first blades and the plurality of second blades based on detection results by the detector.

2. The apparatus according to claim 1, wherein the barycentric position adjusting unit is located on a plane conjugate to a plane on which the original is located or near the conjugate plane.

3. The apparatus according to claim 1, wherein quantity of the exposure light is changed based on an exposure position in a shot region in the first direction of the scanning.

4. A device manufacturing method comprising the steps of:
  exposing a substrate using a scanning exposure apparatus; and
  developing the substrate,
  wherein the scanning exposure apparatus is configured to project a pattern of an original onto a substrate by a projection optical system while scanning the original and the substrate along a first direction, thereby exposing the substrate, and the exposure apparatus comprising:
  a barycentric position adjusting unit configured to adjust a barycentric position, in the first direction, of exposure light that irradiates an image plane of the projection optical system; and
  a detector mounted on a substrate stage and configured to detect the barycentric position, in the first direction, of the exposure light at each of a plurality of image heights in a second direction that is perpendicular to the first direction, by detecting quantity of the exposure light when the substrate stage is scanned in the first direction,
  wherein the barycentric position adjusting unit includes a plurality of first blades arranged along the second direction, and a plurality of second blades arranged along the second direction such that edges of the plurality of second blades face edges of the plurality of first blades, the plurality of first blades first blades and the plurality of second blades defining an illumination region of the original, and
  wherein the barycentric position adjusting unit adjusts the barycentric position in the first direction at each of the plurality of image heights in the second direction by adjusting the plurality of first blades and the plurality of second blades based on detection results by the detector.

5. The apparatus according to claim 1, further comprising:
  a controller for obtaining a target barycentric position at each of the plurality of image heights in the second direction,
  wherein the barycentric position adjusting unit adjusts the barycentric position in the first direction at each of the plurality of image heights in the second direction so as to meet the target barycentric position.

* * * * *